Dec. 10, 1963

P. R. GILSON ETAL 3,114,054

CIRCUIT INCLUDING AN "AND" GATE FOR PULSING A CAPACITIVE LOAD

Filed July 22, 1960

INVENTORS
PAUL R. GILSON
WILLIAM L. KITCHENS
BY
Louis J. Knobbe
ATTORNEY

United States Patent Office 3,114,054

Patented Dec. 10, 1963

3,114,054

CIRCUIT INCLUDING AN "AND" GATE FOR PULSING A CAPACITIVE LOAD

Paul R. Gilson, West Covina, and William L. Kitchens, Costa Mesa, Calif., assignors to Beckman Instruments, Inc., a corporation of California Filed July 22, 1960, Ser. No. 44,643
3 Claims. (Cl. 307—88.5)

This invention relates to pulse driver circuitry and more particularly to circuitry for pulsing loads having a capacitive reactance.

In high speed digital circuitry, data handling systems, and other pulsed circuitry it is necessary to generate and transmit pulses having very brief rise and fall times. In circuits containing capacitive reactance, the problem of generating and transferring such pulses is increased since the capacitance must be charged and discharged through a very low impedance in order to effectively reduce the time delay therefor. Such capacitive loads are quite common since they exist not only when a capacitor is used as a component of the circuit but also because of such capacities as the capacitance inherent in coaxial conductors and the interwiring capacitances of connecting leads.

In order to successfully provide steep pulses in capacitive circuitry, a pulse driver circuit should necessarily permit current flow in both directions through a low impedance so that the capacitanace will be charged and discharged through the desired low impedance. Circuitry heretofore used for this function in a type of relaxation oscillator known as a "blocking" oscillator. This oscillatory circuit, however, has the disadvantage that only the timing of leading edge of the output pulse can be externally controlled; the timing of the trailing edge is dependent upon the blocking oscillator circuit components and the loads connected thereto. Another disadvantage particularly affecting transistorized blocking oscillators is that transformer voltage overshoot necessitates utilizing transistors having high collector-to-base and emitter-to-base voltage ratings.

Because of the low power requirements and increased reliability of transistor circuitry, alternative transistor circuitry has been sought to overcome these problems. However, until the present invention no successful transistor pulse driver circuit has been available.

Another functional requirement which is common in pulsed circuitry is that an output pulse is desired only upon the coincidence of two or more input pulses. For example, systems operating under the control of a master clock require the generation of many pulses in synchronism with the clock pulses. Accordingly, a transistor circuit which combines the logic of an AND gate with the capability of pulsing capacitive loads is required.

Still another function commonly required in digital systems, etc., is the regeneration of pulses to compensate for losses within the system.

It is therefore the primary object of this invention to provide a transistorized pulse driver circuit which permits curent to flow in both directions through a low impedance source while simultaneously providing other circuit functions.

It is a further object of this invention to provide a pulse driver circuit, AND gate, and regeneration amplifier which utilize common transistor and other circuit elements.

It is another object of this invention to provide a pulse driver circuit for capacitively reactive loads which allows the timing of both the leading and trailing pulse edges to be externally controlled.

Other and further objects, features and advantages of the invention will become apparent as the description proceeds.

Briefly, in accordance with the preferred form of the present invention, there is provided a first transistor having its emitter and collector series connected with a power source and a load. Respective inputs are coupled to second and third transistors each connected in a common emitter configuration. Means are provided for coupling the collectors of each of the second and third transistors to the base of the first transistor. The second and third transistors are used as current switches; when one or both of them are in the conducting state, current is switched from the base of the first transistor so that the base current thereof is substantially diminished. A shunting diode is connected between the base and emitter of the first transistor. This diode is poled so that when it conducts, its voltage drop is sufficient to reverse bias the emitter to base junction of the first transistor and maintain it nonconductive while the second and/or third transistors are conductive. Both of the second and third transistors become nonconductive when simultaneous input pulses are received at their base electrodes. The shunting diode then becomes reverse biased and substantial base current flows in the first transistor driving it into conduction. The load coupled thereto is then charged through its low impedance emitter to collector path. When input pulses are no longer received at the base electrode of either or both of the second and third transistors, the first transistor once again becomes nonconductive. A low impedance discharge path for the load is then provided by the low impedance emitter to collector path of a conductive second and/or third transistor and the then forwardly biased shunting diode.

This circuitry operates as a combined AND gate and pulse driver, a pulse being delivered to the load only upon coincidence of input signals at the bases of the second and third transistors. Accordingly, the timing of both the leading and trailing pulse edges are externally controlled and independent of circuit components or the load. By suitably isolating the collectors of the second and third transistors, a regeneration amplifier may be also incorporated in this unique circuit.

A more thorough understanding of the invention may be obtained by a study of the following detailed description taken in connection with the accompanying drawings in which.

Figures 1, 2:
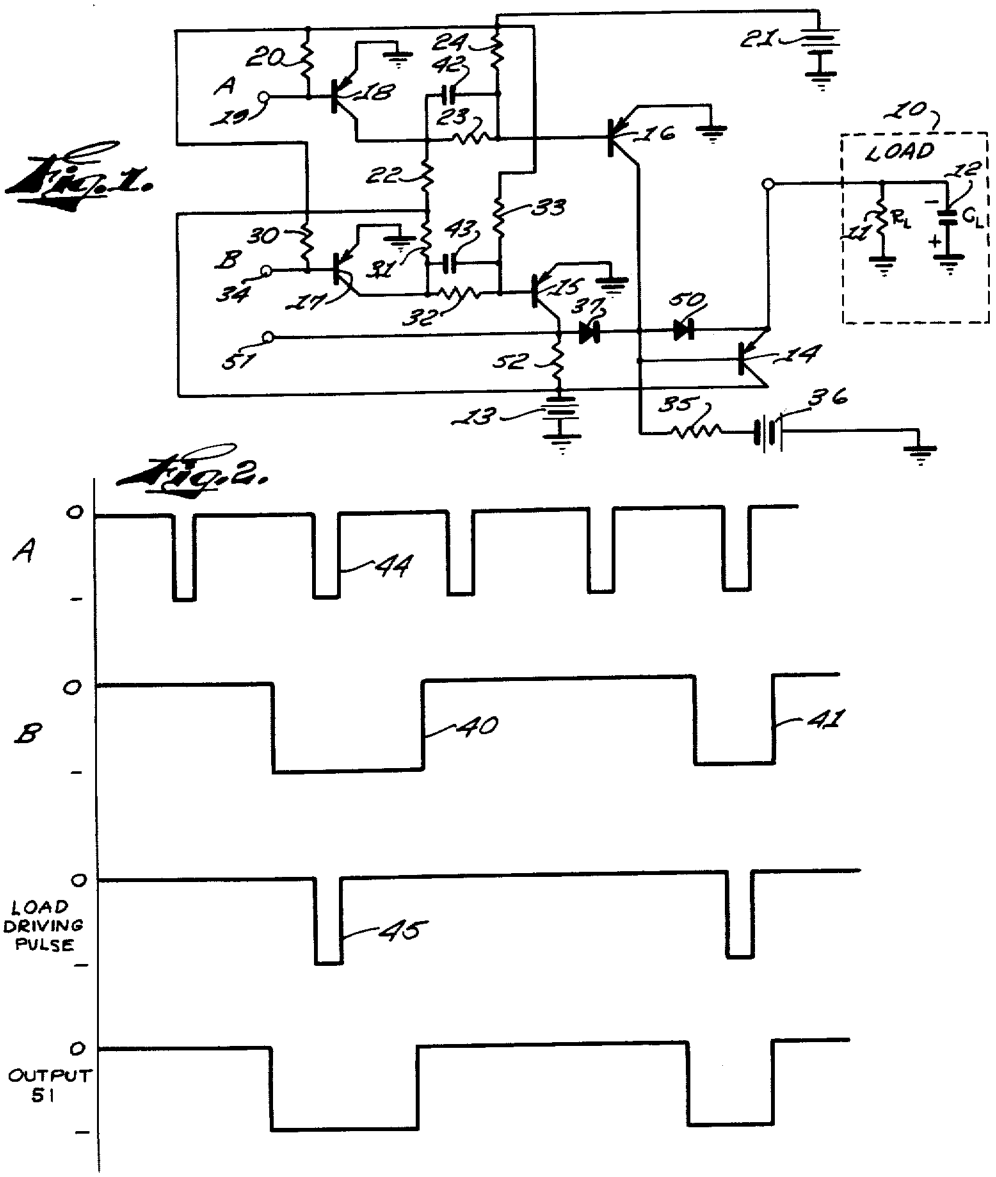
FIG. 1 is a schematic diagram of a combined AND gate, pulse driver, and regeneration amplifier constructed in accordance with this invention.
FIG. 2 illustrates the waveforms at several points in the circuit of FIG. 1.

Referring now to FIG. 1, a pulsed load 10 has a lumped resistive impedance 11 ($R_L$) and a lumped parallel capacitance 12 ($C_L$). Capacitance 12 may be one which is connected as part of the load circuit and/or extraneous circuit capacities such as interwiring capacitance. Load 10 is connected in series with a direct current voltage source 13 and the emitter and collector of transistor 14. Thus, capacitor 12 is charged by source 13 whenever transistor 14 conducts and presents a low impedance between its emitter and collector.

Transistors 15 and 16 each connected in a common emitter configuration act as current switches for controlling the base current of transistor 14 and thereby the pulsing of the load 10. Transistors 15 and 16 are respectively driven by transistors 17 and 18 also connected as common emitter amplifiers. With no pulse on the A terminal 19, the base of transistor 18 is connected through resistance 20 to a source of positive biased potential 21 which reverse biases the emitter to base junction so that transistor 18 is in a nonconducting or OFF state.

Although P-N-P transistors are illustrated, the invention is not limited to this particular type of transistor. For other transistor types such as N-P-N transistors, the circuitry is identical except that the polarities of the direct current sources and diodes are reversed.

The series circuit comprising source 13, resistor 22, resistor 23, resistor 24 and positive bias source 21 serves to forwardly bias the emitter to base junction of transistor 16 when transistor 18 is nonconductive. Accordingly, so long as a negative pulse is not applied to the A terminal 19, transistor 16 is forwardly biased and is in the conductive or On state.

In like manner, the base of transistor 17 is connected to bias source 21 via resistor 30, and a series circuit comprising power source 13, resistor 31, resistor 32, resistor 33 and positive bias source 21 forward biases the emitter to base junction of transistor 15 when transistor 17 is in the nonconductive or Off state. Therefore, so long as a negative pulse is not supplied to either the A terminal 19 or the B terminal 34, each of the transistors 16 and 15 are in their conductive state. The collector of transistor 16 is connected through resistor 35 to negative bias source 36 and the collector of transistor 15 is connected through resistor 52 to voltage source 13 and to bias source 36 through the resistor 35 and a unidirectional current conductive device such as diode 37. Diode 37 is not required for the operation of this particular circuitry, but is included for providing a regeneration of the B pulse at terminal 51 as explained hereinafter. If this latter function is not required, diode 37 may be replaced by a conducting path. When transistor 15 is conductive, its collector electrode is at substantially ground potential so that diode 37 will be forwardly biased and readily conduct current therethrough. When either or both of transistors 15 and 16 are On, current is switched from the base of transistor 14 so that its base current is substantially diminished. This transistor is then driven to its nonconductive or Off state and maintained therein by current flow through a then forwardly biased unidirectional current conductive device such as diode 50, as hereinafter explained. There is then a high impedance between the emitter and collector of transistor 14 so that no power is supplied the load 10 by source 13.

The circuit of FIG. 1 just described, although having several functions, is particularly adapted for serving as a type of AND gate whereby a pulse is supplied to the load only when a control signal and synchronizing pulse are present simultaneously. By way of example, representative input pulses at the A and B terminals 19 and 34 are illustrated in FIG. 2. Also shown in this figure are the resultant output power pulses received by the load 10. As shown, the input to terminal A may comprise a series of negative synchronizing pulses while the control signal at B is illustrated as a negative pulse 40 and a second negative pulse 41 of narrower width. Upon application of the negative pulse 44 at A, the collector electrode of transistor 18 quickly changes from a negative to substantially ground potential. Coupling capacitor 42 which is connected between the collector of transistor 18 and the base of transistor 16 is initially charged because of the potential drop across resistor 23 when transistor 18 is nonconductive and transistor 16 is conductive. Capacitor 42 therefore provides an initially high current flow so as to rapidly cut off transistor 16. Likewise, when a negative pulse is applied to the B terminal 34, intercoupling capacitor 43 permits a very rapid cut off of transistor 15. However, so long as either transistor 15 or 16 is On, the base current of transistor 14 is substantially zero. This transistor is then maintained in its Off state and no output pulse is applied to the load 10. As shown in FIG. 2, when a synchronizing pulse 44 and signal pulse 40 occur simultaneously, a pulse 45 drives the load 10 since at this time, both transistors 15 and 16 are cut off. The collectors of these transistors become negative and diode 50 is reverse biased. With both of the current switches open, substantial base current flows in transistor 14 and this transistor becomes immediately conductive. Load 10 is thereupon connected through its low impedance emitter to collector to voltage source 13. The capacitance in the load 10 represented by lumped capacitor 12 immediately begins to charge through this low impedance with a polarity as indicated in FIG. 1.

Figure 3:
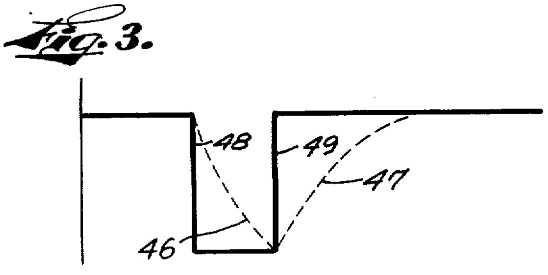
FIG. 3 illustrates the type of output waveform provided by circuitry having a relatively high output impedance as compared with the output waveform provided by the present invention.

The load driving pulse 45 should have a steep leading edge 48 and steep trailing edge 49 shown in FIG. 3. However, unless a capacitive load is charged and discharged through a low impedance, the actual output pulse will appear as shown in FIG. 3 with a sloping leading edge 46 and sloping trailing edge 47. The present invention obviates the sloping leading edge 46 by charging the load capacitance through a low impedance conductive transistor 14. The present invention also obviates the sloping trailing edge 47. When, for example, synchronizing pulse 44 applied to the A terminal terminates, the transistor 18 immediately becomes nonconductive. Transistor 16 is then forwardly biased and is changed to its On state. The load 10 is then connected in series with diode 50 and the emitter and collector of transistor 16. Diode 50 is forwardly biased because of the substantially ground potential at the collector of transistor 16 and the negative charge on capacitor 12 connected to its cathode. The charge on capacitor 12 is then discharged through the low impedance path of diode 50 and transistor 16 so that the substantially perpendicular trailing edge 49 results instead of the sloping edge 47. Diode 50 is connected with its anode to the base and its cathode to the emitter of transistor 14 so that the small voltage drop of diode 50 during forward current conduction is sufficient to reverse bias the emitter to base junction of transistor 14 and maintain this transistor Off. This circuit operation requires an amplifying device having the characteristics of a transistor, such devices as vacuum tubes would not be biased to cutoff by the very low potential drop across diode 50 during forward current flow therethrough.

The series path of transistor 15 and diode 37 is in parallel to that of transistor 16 and may likewise serve to rapidly discharge capacitor 12 of load 10 when transistor 16 is On. Since either or both of the current switching transistors 15 and 16 are On when the output pulse is turned Off, the load will always be discharged through a low impedance path to ground.

It will be apparent that the AND gate of this invention is not limited to two inputs. Additional common emitter current switching stages similar to transistor stages 15, 17 and 16, 18 coupled to the base of transistor 14 will serve to provide additional inputs at their respective bases.

Referring again to FIG. 2 it will be apparent that the circuit of FIG. 1 provides an output pulse having very steep leading and trailing edges for driving a load having capacitive reactance while also serving the dual function of an AND gate. This invention also affords an external control over the timing of both the leading and trailing pulse edges, since the timing of both are determined by the synchronizing pulse 44 introduced at the A terminal.

Still another function may be afforded by this invention by connecting an output terminal 51 to the collector of transistor 15 and connecting diode 37 between this collector and the common junction of the collector of transistor 16, the anode of diode 50 and the base of transistor 14. This circuitry provides a duplicate of the input B pulse at terminal 51 after having been amplified through the transistor stages 17 and 15 and operates as follows: Terminal 51 is properly grounded when transistor 15 is On. Diode 37 is then conductive. When transistor 15 is Off (upon receipt of an input B pulse) the output at terminal 51 will become negative and remain so until the termination of the B pulse. Were diode 37 shorted, however, the output at terminal 51 would instead become grounded at the termination of the input A pulse. Accordingly, diode 37 serves to appropriately isolate output terminal 51 from the remainder of the circuitry, without interfering with the operation thereof. Thus, the output of terminal 51 is a regeneration of the input signal pulses appearing at the B terminal 34 and may be connected to other inputs throughout the data handling system, digital computer or other apparatus in which the pulse driving circuit is being utilized. Such regeneration of a control signal is a common necessity in such systems and is ordinarily accomplished by separate amplifying stages. The present invention obviates the use of additional transistor elements and associated circuit components and thereby provides a maximum utilization of the circuit components as a combined AND gate, pulse driving circuit for capacitive load, and a pulse regeneration amplifier.

By way of illustration only, the following components may be used to construct an operable embodiment of this invention:

| | |
|---|---|
| Voltage source **13** | 12 volts. |
| Transistors **14, 15** | 2N597. |
| Transistors **16, 17, 18** | 2N404. |
| Resistors **20, 30** | 13K ohms. |
| Bias source **21** | 7 volts. |
| Resistors **22, 31** | 1.3K ohms. |
| Resistors **23, 32** | 1.5K ohms. |
| Resistors **24, 33** | 6.8K ohms. |
| Resistor **35** | 2.4K ohms. |
| Bias source **36** | 30 volts. |
| Diodes **37, 50** | Clevite CTP661. |
| Capacitors **42, 43** | 1000 micromicrofarads. |
| Resistor **52** | 5.1K ohms. |

Although exemplary embodiments of the invention have been disclosed and discussed, it will be understood that other applications of the invention are possible and that the embodiments disclosed may be subjected to various changes, modifications and substitutions without necessarily departing from the spirit of the invention.

We claim:

1. A circuit having the multiple functions of AND gate, pulse driver for a capacitive reactance load, and a pulse regeneration amplifier comprising first, second and third transistors each having emitter, base and collector electrodes; a power source; means for charging said load through a low impedance comprising a series connection of said power source, the emitter and collector electrodes of said first transistor, and said load; first and second diodes; means for discharging said load through a low impedance comprising a series connection of only said load, said first diode and the emitter and collector electrodes of said second transistor, and a series connection of only said load, said first diode, said second diode, and the emitter and collector electrodes of said third transistor; the inputs to said AND gate and pulse driver comprising the base electrodes of said second and third transistors; and said regeneration amplifier means having as its input the base electrode of said third transistor and as its output the collector electrode of said third transistor.

2. A combined pulse driver, AND gate, and regeneration amplifier for a capacitive reactance load comprising first, second, third, fourth and fifth transistors, each having emitter, base, and collector electrodes; a power source; a first series circuit comprising said power source, the collector and emitter electrodes of said first transistor, and said load; a first diode connected between the emitter and base electrodes of said first transistor; a second series circuit comprising a bias source, a first resistor, and the emitter and collector electrodes of said second transistor; a third series circuit comprising said power source, a second resistor, and the emitter and collector electrodes of said third transistor; a fourth series circuit comprising said bias source, said first resistor, a second diode, and the emitter and collector electrodes of said third transistor; and a connection between the base electrode of said first transistor and the collector electrode of said second transistor and an electrode of said second diode, the emitters of said second, third, fourth and fifth transistors being connected to a common terminal, the collector of said fourth transistor being connected to the base of said second transistor, the collector of said fifth transistor being connected to the base of said third transistor, the inputs to said pulse driver and AND gate comprising the base electrodes of said fourth and fifth transistors, the input to said regeneration amplifier comprising the base electrode of said fifth transistor, the output of said pulse driver and AND gate comprising the emitter electrode of said first transistor, and the output of said regeneration amplifier comprising the collector electrode of said third transistor.

3. A combined pulse driver, AND gate, and regeneration amplifier for a capacitive reactance load comprising first, second, third, fourth and fifth transistors each having first, second and third electrodes; a power source; a first series circuit comprising said power source, the first and second electrodes of said first transistor, and said load; a first diode connected between the second and third electrodes of said first transistor; a second series circuit comprising a bias source, a first resistor, and the first and second electrodes of said second transistor; a third series circuit comprising said power source, a second resistor, and the first and second electrodes of said third transistor; a fourth series circuit comprising said bias source, said first resistor, a second diode, and the first and second electrodes of said third transistor; and a connection between the third electrode of said first transistor and the first electrode of said second transistor and an electrode of said second diode, the first electrode of said fourth transistor being connected to the third electrode of said second transistor, the first electrode of said fifth transistor being connected to the third electrode of said third transistor, the second electrode of each of said second, third, fourth and fifth transistors being connected to a common terminal, the inputs to said pulse driver and AND gate comprising the third electrodes of said fourth and fifth transistors, the input to said regeneration amplifier comprising the third electrode of said fifth transistor, the output of said pulse driver and AND gate comprising the second electrode of said first transistor, and the output of said regeneration amplifier comprising the first electrode of said third transistor.

References Cited in the file of this patent

UNITED STATES PATENTS 2,973,437 Bradley et al. ............ Feb. 28, 1961

FOREIGN PATENTS 1,039,570 Germany .............. Sept. 25, 1958

OTHER REFERENCES

IBM Technical Disclosure Bulletin, Vol. 2, No. 4, December 1959, pages 84, 85, "Emitter Follower Logical Circuits," Yourke et al.

UNITED STATES PATENT OFFICE
CERTIFICATE OF CORRECTION

Patent No. 3,114,054 December 10, 1963

Paul R. Gilson et al.

It is hereby certified that error appears in the above numbered patent requiring correction and that the said Letters Patent should read as corrected below.

Column 4, line 36, before "such" insert -- since --.

Signed and sealed this 30th day of June 1964.

(SEAL)
Attest:

ERNEST W. SWIDER
Attesting Officer

EDWARD J. BRENNER
Commissioner of Patents